United States Patent
Wu

(10) Patent No.: US 9,726,712 B2
(45) Date of Patent: Aug. 8, 2017

(54) INSULATED GATE BIPOLAR TRANSISTOR FAILURE MODE DETECTION AND PROTECTION SYSTEM AND METHOD

(71) Applicant: GENERAL ELECTRIC COMPANY, Schenectady, NY (US)

(72) Inventor: Tao Wu, ShangHai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 338 days.

(21) Appl. No.: 14/284,895

(22) Filed: May 22, 2014

(65) Prior Publication Data

US 2014/0368232 A1 Dec. 18, 2014

(30) Foreign Application Priority Data

Jun. 13, 2013 (CN) .......................... 2013 1 0232724

(51) Int. Cl.
*G01R 31/26* (2014.01)
*H02M 1/088* (2006.01)
(Continued)

(52) U.S. Cl.
CPC ....... *G01R 31/2612* (2013.01); *G01R 31/261* (2013.01); *G01R 31/2614* (2013.01);
(Continued)

(58) Field of Classification Search
CPC ....... H01L 21/00; H01L 2221/00; G01R 1/00; G09G 1/00; G09G 2230/00
See application file for complete search history.

(56) References Cited

U.S. PATENT DOCUMENTS 5,365,397 A 11/1994 Kadota
6,297,661 B1 10/2001 Chen et al.
(Continued)

FOREIGN PATENT DOCUMENTS

CN 1988385 A 6/2007
CN 102136720 A 7/2011
(Continued)

OTHER PUBLICATIONS

Fujii, K. et al., "STATCOM Applying Flat-Packaged IGBTs Connected in Series", 35th Annual IEEE Power Electronics Specialists Conference, Germany, Jun. 20-25, 2004, pp. 2528-2532.
(Continued)

*Primary Examiner* — Jermele M Hollington
*Assistant Examiner* — Temilade Rhodes-Vivour
(74) *Attorney, Agent, or Firm* — GE Global Patent Operation; Scott R. Stanley

(57) ABSTRACT

An assembly including an insulated gate bipolar transistor (IGBT) is provided. The IGBT is coupled with a gate driver for receiving a gating signal to drive the IGBT and providing a feedback signal of the IGBT which indicates a change of a collector-emitter voltage of the IGBT. The assembly further includes a failure mode detection unit for determining whether the IGBT is faulted based on a timing sequence of the gating signal and feedback signal. The failure mode detection unit is capable of differentiating fault types including a gate driver fault, a failed turn-on fault, a short-circuit fault, a turn-on over-voltage fault and a turn-off over-voltage fault. Accordingly, an IGBT failure mode detection method is also provided.

14 Claims, 5 Drawing Sheets

(51) Int. Cl.
*H02M 1/32* (2007.01)
*H03K 17/082* (2006.01)
*H03K 17/18* (2006.01)
*H01L 21/00* (2006.01)
*H03K 17/10* (2006.01)

(52) U.S. Cl.
CPC ............. *H02M 1/088* (2013.01); *H02M 1/32* (2013.01); *H03K 17/0828* (2013.01); *H03K 17/18* (2013.01); *G09G 2230/00* (2013.01); *H01L 21/00* (2013.01); *H01L 2221/00* (2013.01); *H03K 17/10* (2013.01)

(56) References Cited

U.S. PATENT DOCUMENTS

| | | | | |
|---|---|---|---|---|
| 2005/0286200 | A1* | 12/2005 | Ohshima | H03K 17/0822 361/160 |
| 2007/0058403 | A1* | 3/2007 | Oughton | H02M 1/08 363/127 |
| 2007/0139841 | A1* | 6/2007 | Ohshima | H03K 17/18 361/100 |
| 2012/0147634 | A1* | 6/2012 | Jones | H02M 1/32 363/37 |
| 2013/0242438 | A1* | 9/2013 | Fukuta | H02H 1/0007 361/18 |
| 2013/0257177 | A1* | 10/2013 | Jacobson | H02M 1/08 307/115 |

FOREIGN PATENT DOCUMENTS

| | | |
|---|---|---|
| CN | 202059165 U | 11/2011 |
| CN | 102445647 A | 5/2012 |
| CN | 102539952 A | 7/2012 |
| CN | 102654557 A | 9/2012 |
| CN | 101707432 B | 1/2013 |
| JP | 4920434 B2 | 4/2012 |
| JP | 4984746 B2 | 7/2012 |
| WO | 2012175109 A1 | 12/2012 |

OTHER PUBLICATIONS

Ruedi, Heinz et al., "Driver Solutions for High-Voltage IGBTs", PCIM Europe-Power Electronics Magazine, Apr. 30, 2002, pp. 1-11.
Ruedi, Heinz et al., "Dynamic Gate Controller (DGC) A New IGBT Gate Unit for High Current/High Voltage IGBT Modules", PCIM. Europe. Official Proceedings of the International Power Conversion Conference on Power Electronics, Drives and Motion, Jun. 1, 1995, pp. 241-249.
Uchida, Y. et al., "Development of High Power Press-Pack IGBT and It's Applications", 22nd International Conference on Microelectronics, May 14, 2000, vol. No. 1, pp. 125-129.
Gunturi, S. et al., "On the Operation of a Press Pack IGBT Module Under Short Circuit Conditions", IEEE Transactions on Advanced Packaging, Aug. 1, 2006, vol. No. 29, Issue No. 3, pp. 433-440.
European Search Report issued in connection with corresponding EP Application No. 14171718.1-1805 on Oct. 24, 2014.
Byoung et al., "A Novel Short-Circuit Detecting Scheme Using Turn-On Switching Characteristic of IGBT", IEEE Industry Applications Society annual Meeting, pp. 1-5, Oct. 5-9, 2008, Location: Edmonton, Alta.
Jemina et al., "A Fault Detection Strategy for IGBT Based on Gate-Voltage and Current Transformer Behavior Applied to a Motor Drive System", Bonfring International Journal of power systems and integrated circuits, vol. 2, pp. 9-14, Feb. 2012.
Unofficial English Translation of Chinese Office Action issued in connection with corresponding CN Application No. 2013102327244 on Jul. 11, 2016.

* cited by examiner

INSULATED GATE BIPOLAR TRANSISTOR FAILURE MODE DETECTION AND PROTECTION SYSTEM AND METHOD

BACKGROUND

An insulated gate bipolar transistor (IGBT) is a switching transistor used to permit power flow in when it is on and to stop power flow when it is off. It is a solid-state device and has no physical moving parts. Instead of opening and closing a physical connection, the IGBT is operated by applying voltage to a semiconductor component, which changes its properties to create or block an electrical path. IGBTs are commonly used as switches, e.g. in chopper and frequency converter applications, to control and convert electrical power by switching electrical devices on and off at predetermined instances.

IGBT may either be used singly or connected in series. Generally, series operation of IGBTs is considered as a straightforward method to be used in high voltage power conversion. Failure of any one IGBT located in the series string of the IGBTs may result in the abnormal operation of the overall series-connected IGBTs, and even worse the overall IGBT phase legs may be damaged. For example, failure of any one IGBT in the series string may cause voltage unbalance issues and thus affect the robustness and reliability of the overall series-connected IGBTs. Therefore, it is desirable to achieve fast and accurate fault detection, including the fault type as well as the location for the failed IGBT among series-connected IGBTs.

BRIEF DESCRIPTION

In accordance with an embodiment disclosed herein, an assembly including an insulated gate bipolar transistor (IGBT) is provided. The IGBT is coupled with a gate driver for receiving a gating signal to drive the IGBT and providing a feedback signal of the IGBT which indicates a change of a collector-emitter voltage of the IGBT. The assembly further includes a failure mode detection unit for determining whether the IGBT is faulted and for differentiating fault types including a gate driver fault, a failed turn-on fault, a short-circuit fault, a turn-on over-voltage fault and a turn-off over-voltage fault based on a timing sequence of the gating signal and the feedback signal.

In accordance with another embodiment disclosed herein, an IGBT failure mode detection method is provided. In the method, a gating signal is sent to drive one or more series connected IGBTs, and a feedback signal of each IGBT, which indicates a change of a collector-emitter voltage of the IGBT is provided. A timing sequence of the gating signal and feedback signal of each IGBT is compared with a reference timing sequence to determine whether the IGBT is faulted and, if the IGBT is faulted, to differentiate fault types including a gate driver fault, a failed turn-on fault, a short-circuit fault, a turn-on over-voltage fault and a turn-off over-voltage fault.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Failure mode monitoring and protection are important for guaranteeing the mean time between failures (MTBF) of medium voltage drive systems, which usually use one or more insulated gate bipolar transistors (IGBT). Thus it is important to provide IGBT failure mode detection and protection units/methods for detecting any fault of the one or more IGBTs quickly and accurately.

Embodiments of the invention provide an assembly including one or more series connected IGBTs. Each IGBT is coupled with a gate driver for receiving a gating signal to drive the IGBT and providing a feedback signal of the IGBT, and is further provided with a failure mode detection unit. The failure mode detection unit is programmed to determine whether the IGBT is faulted and identify which type of fault it is based on a timing sequence of the gating signal and feedback signal. The failure mode detection unit is capable of differentiating the common types of faults that might occur to the one or more series-connected IGBTs, including a gate driver fault, a failed turn-on fault, a short-circuit fault, a turn-on over-voltage fault and a turn-off over-voltage fault.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. Moreover, the terms "coupled" and "connected" are not intended to distinguish between a direct or indirect coupling/connection between two components. Rather, such components may be directly or indirectly coupled/connected unless otherwise indicated.

Figure 1:
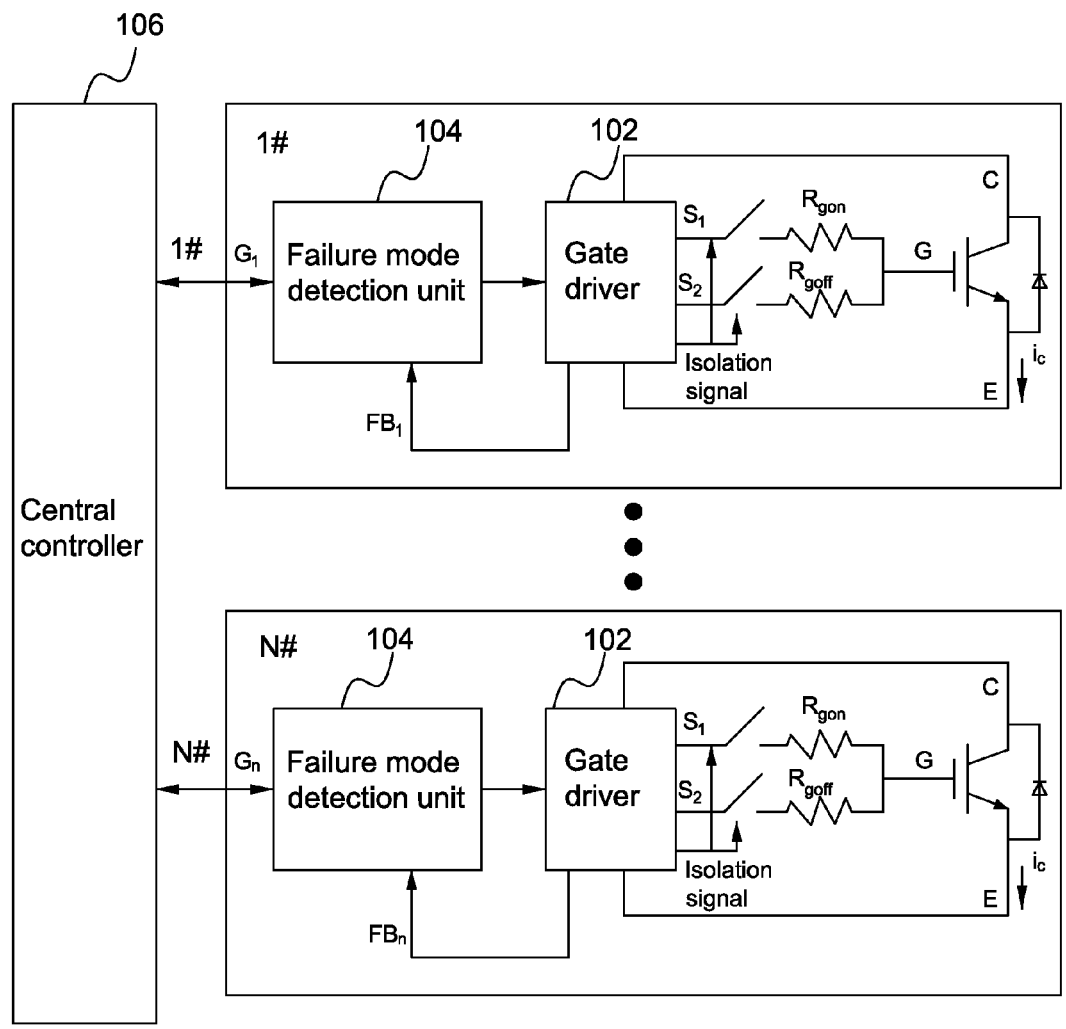
FIG. 1 is a block diagram of an exemplary assembly including one or more series connected IGBTs, each of which is coupled with a failure mode detection unit, according to one embodiment of the present invention.

FIG. 1 shows a block diagram of an assembly comprising N (N is a natural number and N≥1) series-connected IGBTs, each of which is provided with a failure mode detection unit for detecting an IGBT failure and the failure mode. As shown in FIG. 1, each of the IGBTs has a gate terminal (G), an emitter terminal (E) and a collector terminal (C), wherein the gate terminal is coupled to a gate driver 102. A failure mode detection unit 104 either combined with or coupled to the gate driver of each IGBT. The one or more failure mode detection unit(s) 104 may be integrated in and/or communicate with a central controller 106 used to control the whole assembly. Examples of control systems suitable to be used as the central controller herein include but are not limited to complex programmable logic devices (CPID), field-programmable gate arrays (FPGA), or single chip microcomputers (SCM).

A gating signal (G1, G2, . . . , or Gn) is sent to each gate driver 102, which converts the gating signal to drive power to make the IGBT turn on or off quickly. A feedback signal (FB1, FB2, . . . , or FBn), which indicates the change of the collector-emitter voltage of the IGBT in response to the gating signal, is provided to the corresponding failure mode detection unit 104. The failure mode detection unit 104 is programmed to determine whether the corresponding IGBT is faulted and identify which type of fault it is if the corresponding IGBT is faulted, based on a timing sequence of the gating signal and feedback signal. Once the fault type and location is recognized, the central controller 106 may send a fault clearance signal (FC1, FC2, . . . , or FCn) to the gate driver 102 to deal with the fault.

The failure mode detection unit 104 may be programmed to process the gating signal and the feed-back signal of the corresponding IGBT to determine if the corresponding IGBT is faulted and further determine the fault type if the corresponding IGBT is faulted, which will be described in details hereafter below.

Figure 2:
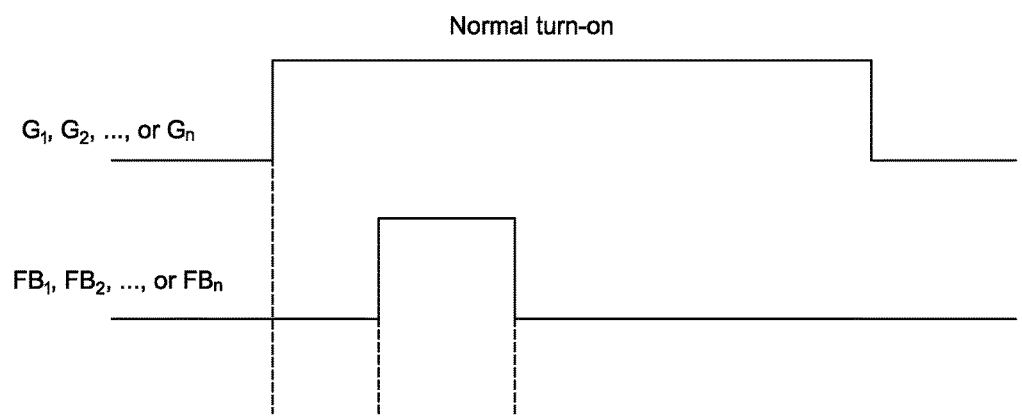
FIG. 2 shows a timing sequence of a gating signal sent to an IGBT and a feedback signal of the Karr in response to a rising edge of the gating signal, when the IGBT is in a normal mode.
Figure 3:
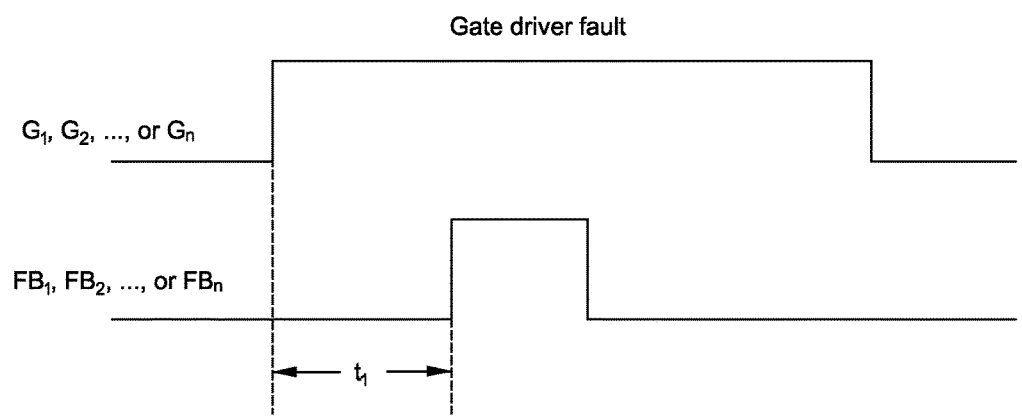
FIG. 3 shows a timing sequence of a gating signal sent to an IGBT and a feedback signal of the IGBT in response to a rising edge of the gating signal, during a gate driver fault.
Figure 4:
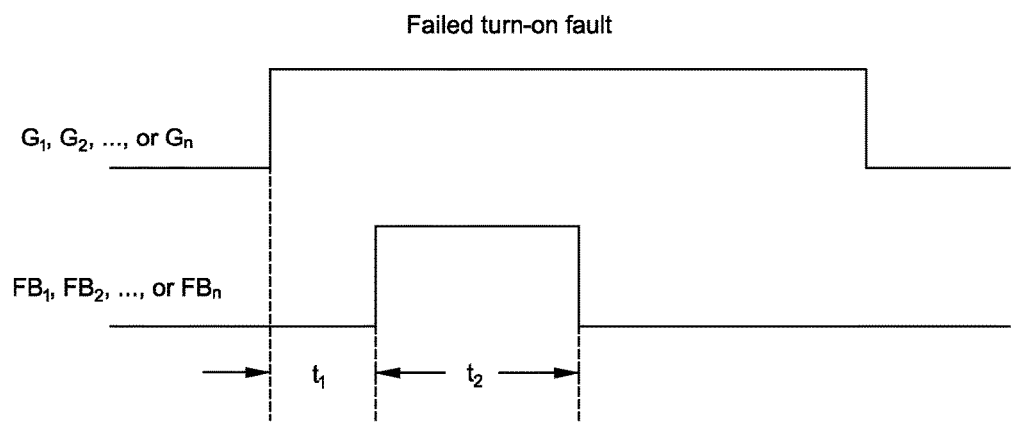
FIG. 4 shows a timing sequence of a gating signal sent to an IGBT and a feedback signal of the IGBT in response to a rising edge of the gating signal, during a failed turn-on fault.
Figure 5:
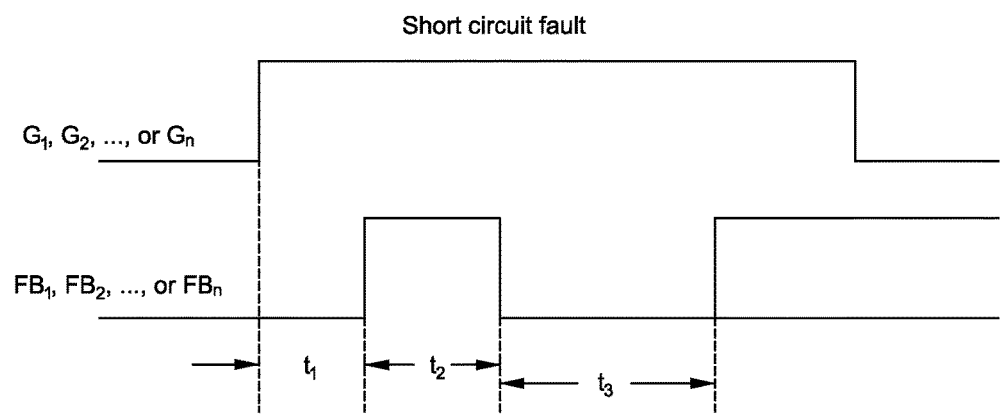
FIG. 5 shows a timing sequence of a gating signal sent to an IGBT and a feedback signal of the IGBT in response to a rising edge of the gating signal, during a short circuit fault.
Figure 6:
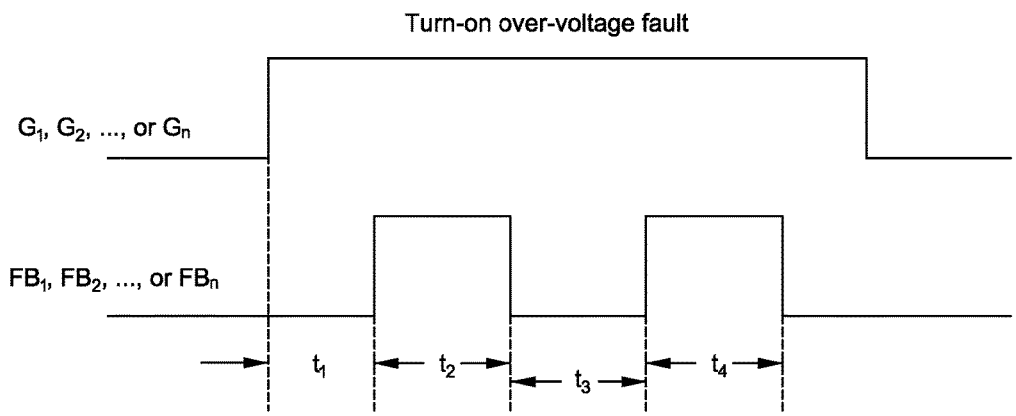
FIG. 6 shows a timing sequence of a gating signal sent to an IGBT and a feedback signal of the IGBT in response to a rising edge of the gating signal, during a turn-on over-voltage fault.
Figure 7:
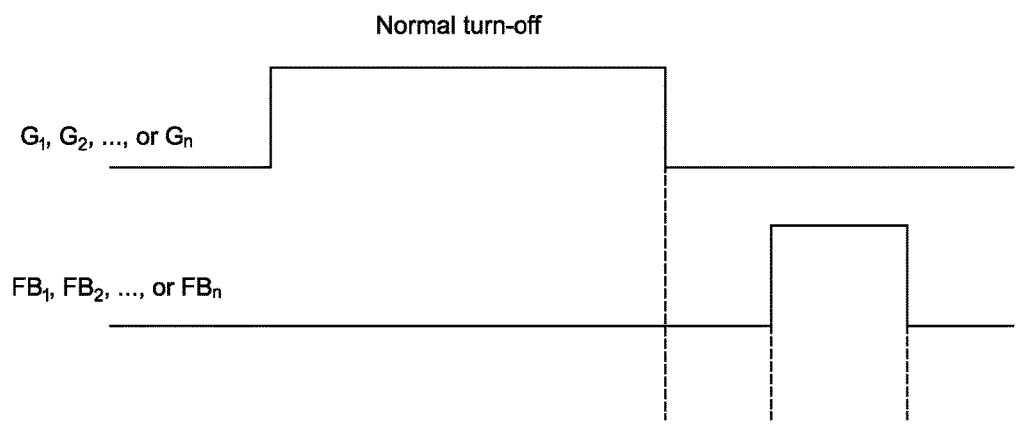
FIG. 7 shows a timing sequence of a gating signal sent to an IGBT and a feedback signal of the IGBT in response to a falling edge of the gating signal, when the IGBT is in a normal mode.
Figure 8:
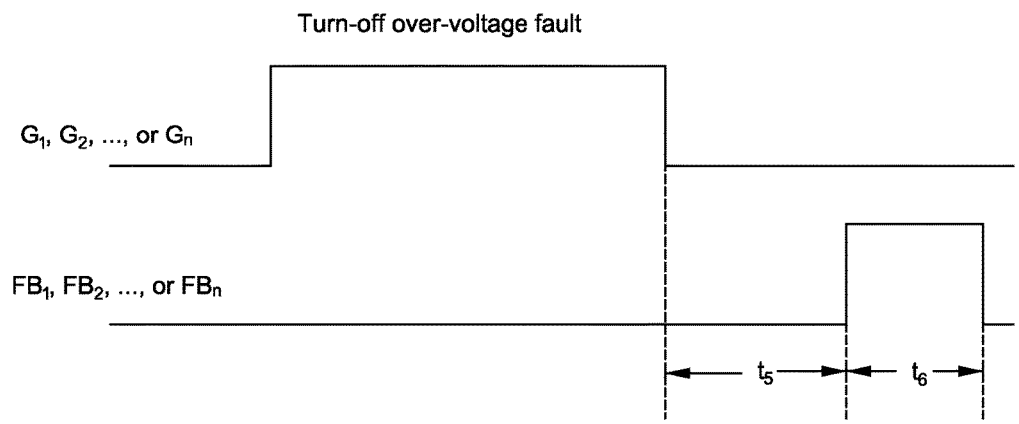
FIG. 8 shows a timing sequence of a gating signal sent to an IGBT and a feedback signal of the IGBT in response to a falling edge of the gating signal, during a turn-off over-voltage fault.

Referring to FIGS. 2-8, as to an IGBT in a normal mode, a pulse with certain duration (e.g., 900 ns) for its feedback signal will be generated after every rising or falling edge of the gating signal, which indicates the turn-on/turn-off transience of the IGBT. However, once a fault occurs to the IGBT or its gate driver, its feedback signal may be different from that of the IGBT in the normal mode. For example, when the IGBT is in a normal turn-on mode, as shown in FIG. 2, a pulse with certain duration for the feedback signal will appear within certain time in response to a rising edge of the gating signal. Once a fault occurs to the gate driver of the IGBT, as shown in FIG. 3, a pulse for the feedback signal in response to the rising edge of the gating signal may be delayed or may even fail to appear. Once a failed turn-on fault occurs to the IGBT, as shown in FIG. 4, the duration of the pulse may last longer in comparison with the normal mode. Once a short circuit fault or a turn-on over-voltage fault occurs, as shown in FIGS. 5 and 6, a second abnormal pulse may be generated after the first normal pulse for the feedback signal in response to the rising edge of the gating signal. When the IGBT is in a normal turn-off mode, as shown in FIG. 7, a pulse with certain duration for the feedback signal will appear within certain time in response to a falling edge of the gating signal. Once a turn-off over-voltage fault occurs, as shown in FIG. 8, a pulse for the feedback signal in response to the falling edge of the gating signal may delay and the duration of the pulse may last longer in comparison with the normal mode.

In some embodiments, the failure mode detection unit is programmed to compare a timing sequence of the gating signal and feedback signal of the corresponding IGBT (actual timing sequence) with a standard timing sequence of the gating signal and feedback signal of an IGBT in a normal mode (reference timing sequence), and thereby determine whether the corresponding IGBT is faulted. Moreover, based on the actual timing sequence, it also can be identified which kind of the fault occurs.

Referring to pies. 2-8, in some specific embodiments, the failure mode detection unit is programmed to compare:

(a) an interval $t_1$ between a rising edge of the gating signal and a rising edge of a first feedback signal pulse that immediately follows the rising edge of the gating signal, with a maximum turn-on ack-wait time $T_1$;

(b) a duration $t_2$ of the first feedback signal pulse, with a maximum turn-on ack time $T_2$;

(c) an interval $t_3$ between a falling edge of the first feedback signal pulse and a rising edge of a second feedback signal pulse that immediately follows the first feedback signal pulse, with a short-circuit blanking time $T_{3\_1}$ and an over-voltage blanking time $T_{3\_2}$;

(d) a duration $t_4$ of the second feedback signal pulse, with a maximum over-voltage time $T_4$;

(e) an interval $t_5$ between a falling edge of the gating signal and a rising edge of a third feedback signal pulse that immediately follows the falling edge of the gating signal pulse, with a maximum turn-off ack-wait time $T_5$; and (f) a duration $t_6$ of the third feedback signal pulse, with a maximum turn-off ack time $T_6$, and thereby determine whether the corresponding IGBT is faulted and differentiate fault types including the gate driver fault, failed turn-on fault, short-circuit fault, turn-on over-voltage fault and turn-off over-voltage fault.

In a specific embodiment, the maximum to ack-wait time $T_1$ is approximately 160 ns, the maximum turn-on ack time $T_2$ is approximately 800 ns, the short-circuit blanking time $T_{3-1}$ is approximately 6 μs (6000 ns), the over-voltage blanking time $T_{3-2}$ is approximately 500 ns, the maximum over-voltage time $T_4$ is approximately 800 ns, the maximum turn-off ack-wait time $T_5$ is approximately 550 ns and the maximum turn-off ack time $T_6$ is approximately 1 μs (1000 ns).

In some embodiments, the failure mode detection unit 104 is programmed to diagnose that:

a gate driver fault occurs if $t_1 > T_1$;

a failed turn-on fault occurs to the IGBT if $t_1 \leq T_1$, $t_2 > T_2$;

a short-circuit fault occurs to the IGBT if $t_1 \leq T_1$, $t_2 \leq T_2$ and $T_{3-2} \leq t_3 \leq T_{3-1}$;

a turn-on over-voltage fault occurs to the IGBT if $t_1 \leq T_1$, $t_2 \leq T_2$, $t_3 \leq T_{3-2}$ and $t_4 \geq T_4$;

a turn-off over-voltage fault occurs to the IGBT if $t_5 > T_5$ and $t_6 > T_6$.

Once any one or more IGBTs are detected by its/their corresponding failure mode detection unit(s) as with any type of fault as described above, a fault signal will be fed back to the central controller 106 to report not only the location of the faulted IGBT but also the fault type. The central controller 106 may send out a fault clearance signal (FC1, FC2, . . . , or FCn) in response to the fault signal, to deal with the faulted IGBT according to the recognized fault type. The fault clearance signal may be an instruction to shut down the gating signal sent to the one or more IGBTs, or an instruction to isolate the faulted IGBT from its gate driver and thereby from the other parts of the assembly, or even an instruction to ignore the fault. The central controller 106 may respond differently to different types of faults, and send out different fault clearance signals in response to different types of faults.

In some embodiments, by series-connecting M (M is a natural number and 1≤M≤N) more redundant IGBTs to N series-connected IGBTs in the assembly, an N+M redundancy operation can be achieved based upon the fault detection method described above to increase the availability of the assembly. For example, in one embodiment, one redundant IGBT is series-connected to the assembly including N series-connected IGBTs to make the assembly actually have N+1 series-connected IGBTs. In this embodiment, once one of the IGBTs is faulted, an N+1 redundancy operation can be realized by ignoring or shorting the faulted IGBT instead of shutting down the gating signal sent to all the IGBTs. The gating signal will not be shut down until a second one of the IGBTs is faulted. In a specific embodiment, the faulted IGBT may be shorted by opening a switch device between the faulted IGBT is and its gate driver and thereby isolating the faulted IGBT from the other parts of the assembly. Therefore in such a specific embodiment, once a first IGBT is identified as being faulted, the central controller 106 sends a fault clearance signal to isolate the faulted IGBT from its gate driver as well as the other parts of the assembly, and once a second IGBT is identified as being faulted, the central controller 106 sends a fault clearance signal to shut down the gating signal sent to all the IGBTs.

In another aspect, IGBT failure mode detection methods are also provided. As to an assembly including one or more series-connected IGBTs, a gating signal is sent to drive the one or more IGBTs, and a feedback signal of each IGBT, which indicates a change of a collector-emitter voltage of the IGBT in response to the gating signal, is provided. By comparing a timing sequence of the gating signal and feedback signal with a reference timing sequence by the methods described above, it is can be determined whether an IGBT is faulted and which type of fault it is if the IGBT is faulted.

Figure 9:
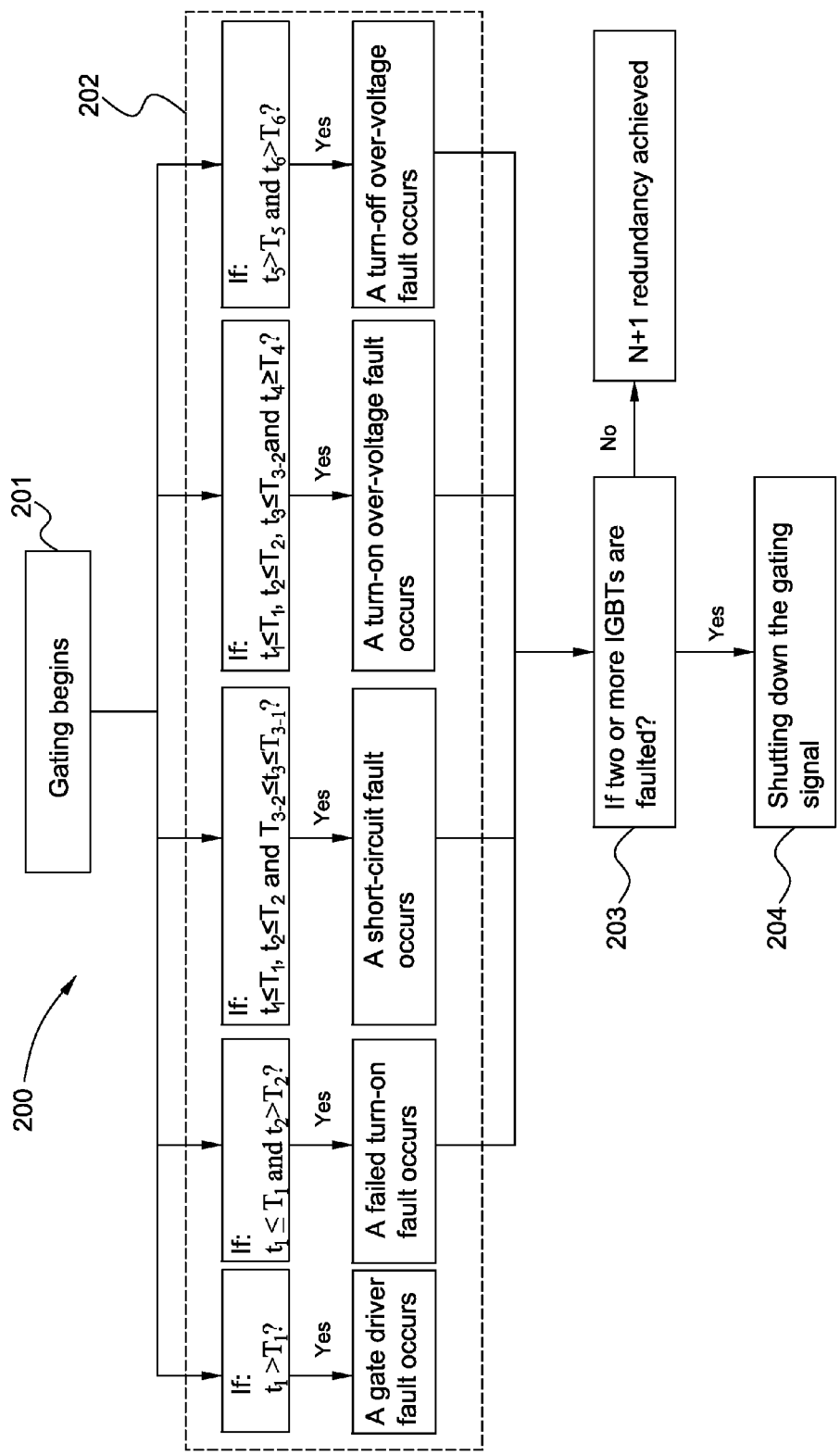
FIG. 9 is a flowchart illustrating an IGBT failure mode detection method according to one embodiment of the present invention.

In a specific embodiment, as shown in FIG. 9, in an IGBT failure mode detection method 200, after gating signals are provided to the plurality of series connected IGBTs and the gating begins in step 201, it is determined for each IGBT if a gate driver fault, failed turn-on fault, short circuit fault, turn-on over-voltage or turn-off over-voltage fault occurs in step 202. It is determined if two or more IGBTs are faulted in step 203, and the gating signal is shut down in step 204 if two or more IGBTs are faulted. Although the example of FIG. 9 is an M=1 example, M may equal any number of one or greater, depending upon how much redundancy is desired. In cases with a number of redundant IGBTs that are greater than 1, whether to isolate or shut down will depend on whether a greater number of IGBTs than the redundant number of IGBTs are faulted.

The above described failure mode detection unit/method provides a self-diagnostic function for the multiple series-connected. IGBTs to identify not only the fault location but also the fault type. The gate driver fault, failed turn-on fault, short circuit fault, turn-on over-voltage or turn-off over-voltage fault can be correctly identified. Further, the assembly using the failure mode detection unit/method is able to achieve the N+M redundancy. As such, the failure mode detection unit/method disclosed herein not only reduces hardware power testing cycle but also significantly reduces the maintenance cost for the hardware maintenance.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

The invention claimed is:

1. An assembly comprising:
an insulated gate bipolar transistor (IGBT), having a first IGBT coupled with a first gate driver for receiving a gating signal to drive the IGBT and providing a feedback signal of the IGBT which indicates a change of a collector-emitter voltage of the IGBT;
at least one additional IGBT having an additional second IGBT coupled with at least one additional second gate driver, wherein the first and additional IGBTs are series connected;
a first failure mode detection unit for determining whether the first IGBT is faulted, and differentiating fault types including a first gate driver fault, failed turn-on fault, a short-circuit fault, a turn-on over-voltage fault and a turn-off over-voltage fault, based on a timing sequence of the gating signal and the feedback signal;
at least one second failure mode detection unit for determining whether the second IGBT is faulted, and differentiating fault types including a second gate driver fault, failed turn-on fault, a short-circuit fault, a turn-on over-voltage fault and a turn-off over-voltage fault, based on a timing sequence of the gating signal and the feedback signal; and
a central controller programmed to send an isolation signal for isolating the faulted IGBT or IGBTs from its gate driver or their gate drivers if the number of faulted IGBTs is less than or equal to the number of redundant IGBTs,
wherein the first and additional IGBTs comprise a number of redundant IGBTs, and there is a switch device between each IGBT and its gate driver.

2. The assembly of claim 1, wherein the central controller is programmed to shut down the gating signal or isolate the IGBT if the IGBT is faulted.

3. The assembly of claim 1, wherein the central controller is programmed to shut down the gating signals if the number of faulted IGBTs is greater than the number of redundant IGBTs.

4. The assembly of claim 1, wherein the failure mode detection unit is programmed to:
compare:
(a) an interval $t_1$ between a rising edge of the gating signal and a rising edge of a first feedback signal pulse that immediately follows the rising edge of the gating signal, with a maximum turn-on ack-wait time $T_1$;
(b) a duration $t_2$ of the first feedback signal pulse, with a maximum turn-on ack time $T_2$;
(c) an interval $t_3$ between a falling edge of the first feedback signal pulse and a rising edge of a second feedback signal pulse that immediately follows the first feedback signal pulse, with a short-circuit blanking time $T_{3-1}$ and an over-voltage blanking time $T_{3-2}$;
(d) a duration $t_4$ of the second feedback signal pulse, with a maximum over-voltage time $T_4$;
(e) an interval $t_5$ between a falling edge of the gating signal and a rising edge of a third feedback signal pulse that immediately follows the falling edge of the gating signal pulse, with a maximum turn-off ack-wait time $T_5$; and (f) a duration $t_6$ of the third feedback signal pulse, with a maximum turn-off ack time $T_6$; and diagnose that:

a gate driver fault occurs if $t_1 > T_1$;

a failed turn-on fault occurs to the IGBT if $t_1 < T_1$ or $t_2 > T_2$;

a short-circuit fault occurs to the IGBT if $t_1 \leq T_1$, $t_2 \leq T_2$ and $T_{3-2} \leq t_3 \leq T_{3-1}$;

a turn-on over-voltage fault occurs to the IGBT if $t_1 \leq T_1$, $t_2 \leq T_2$, $t_3 \leq T_{3-2}$ and $t_4 \geq T_4$;

a turn-off over-voltage fault occurs to the IGBT if $t_5 > T_5$ and $t_6 > T_6$.

5. The assembly of claim 4, wherein $T_1$, $T_2$, $T_{3-1}$, $T_{3-2}$, $T_4$, $T_5$, and $T_6$. are approximately 160 ns, 800 ns, 6 µs, 500 ns, 800 ns, 550 ns and 1 µs, respectively.

6. An insulated gate bipolar transistor (IGBT) failure mode detection method, comprising:

obtaining a gating signal to drive one or more series connected IGBTs;

obtaining a feedback signal of each IGBT, which indicates a change of a collector-emitter voltage of the IGBT;

comparing a timing sequence of the gating signal and feedback signal of each IGBT with a reference timing sequence to determine whether the IGBT is faulted and, if the IGBT is faulted, to differentiate fault types including a gate driver fault, a failed turn-on fault, a short-circuit fault, a turn-on over-voltage fault and a turn-off over-voltage fault; and isolating, if the one or more series connected IGBTs comprise a number of redundant IGBTs, the faulted IGBT or IGBTs from its gate driver or their gate drivers if the number of faulted IGBTs is less than or equal to the number of redundant IGBTs.

7. The method of claim 6, further comprising shutting down the gating signals to all the IGBTs if the number of faulted IGBTs is greater than the number of redundant IGBTs.

8. The method of claim 6, wherein the step of determining whether the IGBT is faulted and differentiating the fault type comprises:

comparing:

(a) an interval $t_1$ between a rising edge of a first gating signal pulse and a rising edge of a first feedback signal pulse that immediately follows the rising edge of the gating signal pulse, with a maximum turn-on ack-wait time $T_1$;

(b) duration $t_2$ of the first feedback signal pulse, with a maximum turn-on ack time $T_2$;

(c) an interval $t_3$ between a falling edge of the first feedback signal pulse and a rising edge of a second feedback signal pulse that immediately follows the first feedback signal pulse, with a short-circuit blanking time $T_{3-1}$ and an over-voltage blanking time $T_{3-2}$;

(d) duration $t_4$ of the second feedback signal pulse, with a maximum over-voltage time $T_4$;

(e) an interval $t_5$ between a falling edge of the first gating signal pulse or a second gating signal pulse and a rising edge of a third feedback signal pulse that immediately follows the falling edge of the first or second gating signal pulse, with a maximum turn-off ack-wait time $T_5$; and (f) duration $t_6$ of third feedback signal pulse, with a maximum turn-off ack time $T_6$; and diagnosing that:

a gate driver fault occurs if $t_1 > T_1$;

a failed turn-on fault occurs to the IGBT if $t_1 \leq T_1$ and $t_2 > T_2$;

a short-circuit fault occurs to the IGBT if $t_1 \leq T_1$, $t_2 \leq T_2$ and $T_{3-2} \leq t_3 \leq T_{3-1}$;

a turn-on over-voltage fault occurs to the IGBT if $t_1 \leq T_1$, $t_2 \leq T_2$, $t_3 \leq T_{3-2}$ and $t_4 \geq T_4$;

a turn-off over-voltage fault occurs to the IGBT if $t_5 > T_5$ and $t_6 > T_6$.

9. The method of claim 8, wherein $T_1$, $T_2$, $T_{3-1}$, $T_{3-2}$, $T_4$, $T_5$, and $T_6$ are approximately 160 ns, 800 ns, 6 µs, 500 ns, 800 ns, 550 ns and 1 µs, respectively.

10. An assembly comprising:

insulated gate bipolar transistors (IGBTs) connected in series, each IGBT having a gate driver for receiving a gating signal to drive the IGBT and providing a feedback signal of the IGBT which indicates a change of a collector-emitter voltage of the IGBT, and a failure mode detection unit for determining whether the IGBT is faulted, and differentiating fault types based on a timing sequence of the gating signal and the feedback signal; and a central controller programmed to send an isolation signal for isolating the faulted IGBT or IGBTs from its gate driver or their gate drivers if the number of faulted IGBTs is less than or equal to the number of redundant IGBTs.

11. The assembly of claim 10, wherein the central controller is programmed to shut down the gating signal or isolate the IGBT if the IGBT is faulted.

12. The assembly of claim 10, wherein the central controller is programmed to shut down the gating signals if the number of faulted IGBTs is greater than the number of redundant IGBTs.

13. The assembly of claim 10, wherein the failure mode detection unit is programmed to:

compare:

(a) an interval $t_1$ between a rising edge of the gating signal and a rising edge of a first feedback signal pulse that immediately follows the rising edge of the gating signal, with a maximum turn-on ack-wait time $T_1$;

(b) a duration $t_2$ of the first feedback signal pulse, with a maximum turn-on ack time $T_2$;

(c) an interval $t_3$ between a falling edge of the first feedback signal pulse and a rising edge of a second feedback signal pulse that immediately follows the first feedback signal pulse, with a short-circuit blanking time $T_{3-1}$ and an over-voltage blanking time $T_{3-2}$;

(d) a duration $t_4$ of the second feedback signal pulse, with a maximum over-voltage time $T_4$;

(e) an interval $t_5$ between a falling edge of the gating signal and a rising edge of a third feedback signal pulse that immediately follows the falling edge of the gating signal pulse, with a maximum turn-off ack-wait time $T_5$; and (f) a duration $t_6$ of the third feedback signal pulse, with a maximum turn-off ack time $T_6$; and diagnose that:

a gate driver fault occurs if $t_1 > T_1$;

a failed turn-on fault occurs to the IGBT if $t_1 < T_1$ or $t_2 > T_2$;

a short-circuit fault occurs to the IGBT if $t_1 \leq T_1$, $t_2 \leq T_2$ and $T_{3-2} \leq t_3 T_{3-1}$;

a turn-on over-voltage fault occurs to the IGBT if $t_1 \leq T_1$, $t_2 \leq T_2$, $t_3 \leq T_{3-2}$ and $t_4 \leq T_4$;

a turn-off over-voltage fault occurs to the IGBT if $t_5 > T_5$ and $t_6 > T_6$.

14. The assembly of claim 13, wherein $T_1$, $T_2$, $T_{3-1}$, $T_{3-2}$, $T_4$, $T_5$, and $T_6$ are approximately 160 ns, 800 ns, 6 µs, 500 ns, 800 ns, 550 ns and 1 µs, respectively.

* * * * *